United States Patent
Kurosawa

(10) Patent No.: US 6,979,993 B2
(45) Date of Patent: Dec. 27, 2005

(54) FREQUENCY ANALYZING METHOD, FREQUENCY ANALYZING APPARATUS, AND SPECTRUM ANALYZER

(75) Inventor: Makoto Kurosawa, Tokyo (JP)

(73) Assignees: Advantest Corporation, Tokyo (JP); Ministry of Internal Affairs & Communication, Tokyo (JP)

(*) Notice: Subject to any disclaimer, the term of this patent is extended or adjusted under 35 U.S.C. 154(b) by 0 days.

(21) Appl. No.: 10/471,498

(22) PCT Filed: Mar. 13, 2002

(86) PCT No.: PCT/JP02/02353

§ 371 (c)(1),
(2), (4) Date: Sep. 11, 2003

(87) PCT Pub. No.: WO02/073222

PCT Pub. Date: Sep. 19, 2002

(65) Prior Publication Data
US 2004/0100244 A1   May 27, 2004

(30) Foreign Application Priority Data
Mar. 14, 2001 (JP) .............................. 2001-072285

(51) Int. Cl.⁷ ............................................ G01R 19/00
(52) U.S. Cl. .............................. 324/76.33; 324/76.19; 702/77
(58) Field of Search ......................... 324/76.19, 76.33, 324/76.31; 702/66, 70, 71, 75–79, 106, 189, 702/191, 193, 195; 708/422

(56) References Cited

U.S. PATENT DOCUMENTS

| 4,023,098 A | * | 5/1977 | Roth ...................... 324/76.33 |
| 4,169,245 A | * | 9/1979 | Crom et al. ............ 324/76.33 |
| 4,782,284 A | * | 11/1988 | Adams et al. .......... 324/76.19 |
| 6,594,605 B2 | * | 7/2003 | Kurosawa .................. 702/106 |

FOREIGN PATENT DOCUMENTS

| JP | 5451872 | 4/1979 |
| JP | 63273015 | 11/1988 |
| JP | 0474985 | 3/1992 |
| JP | 9127237 | 5/1997 |

* cited by examiner

Primary Examiner—Anjan Deb
Assistant Examiner—Timothy J. Dole
(74) Attorney, Agent, or Firm—David N. Lathrop, Esq.; Gallagher & Lathrop

(57) ABSTRACT

There are provided frequency analyzing method and apparatus, and a spectrum analyzer capable of reliably detecting and displaying a radio wave even if the radio wave is a frequency spread or low level one. A signal to be measured existing in a frequency band to be measured is extracted by a plurality of measurement signal extracting devices, and each of the extracted plural signals to be measured is frequency analyzed to compute a correlation value with respect to the plural results of frequency analyses. If the computed correlation value is equal to or greater than a preset value, a decision that the signal to be measured exists in the analyzed frequency is rendered, and if the computed correlation value is smaller than the preset value, a decision that the signal to be measured does not exist in the analyzed frequency is rendered. The decision results are displayed.

13 Claims, 8 Drawing Sheets

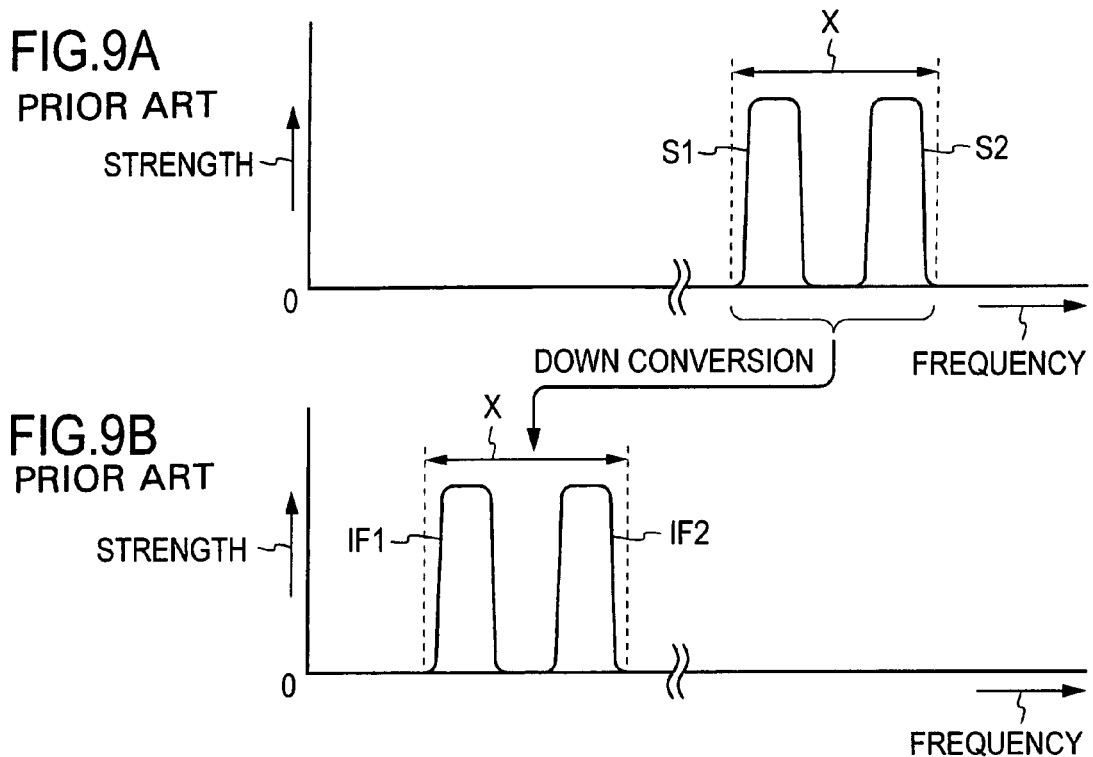
FIG.9A PRIOR ART
FIG.9B PRIOR ART
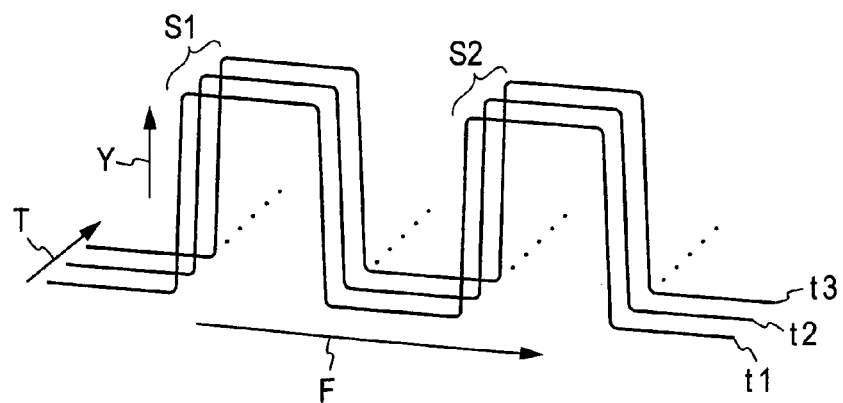
FIG.10 PRIOR ART

FREQUENCY ANALYZING METHOD, FREQUENCY ANALYZING APPARATUS, AND SPECTRUM ANALYZER

TECHNICAL FIELD

The present invention relates to a frequency analyzing method that can be suitably used in case of extracting a signal existing in a specified frequency band, and analyzing the frequency of the extracted signal, and a frequency analyzing apparatus using such frequency analyzing method, and to a spectrum analyzer including such frequency analyzing apparatus built therein.

BACKGROUND ART

One example of the frequency analyzing apparatus of this kind and one example of the spectrum analyzer including this frequency analyzing apparatus built therein are shown in FIG. 8. Further, in the illustrated examples, a part that detects a signal to be measured and analyzes the frequency of the detected signal will be referred to as "frequency analyzing apparatus" and the whole construction including the frequency analyzing apparatus and a display that displays the result of analysis carried out by the frequency analyzing apparatus will be referred to as "spectrum analyzer".

As shown in FIG. 8, the prior art frequency analyzing apparatus 100 comprises a signal extracting device 11 that extracts a signal existing in a specified frequency band X to be measured (see FIG. 9A), an analog-to-digital converter (hereinafter, referred to as A/D converter) 12 connected to the signal extracting device 11, a frequency analyzing part 13 that analyzes the frequency of digital data outputted from the A/D converter 12, a buffer memory 16 that stores the result of frequency analysis outputted from the frequency analyzing part 13, a clock source 14 that applies a clock signal to the A/D converter 12, and a frequency divider or demultiplier 15 that frequency divides a clock signal supplied thereto from the clock source 14 and supplies the frequency divided clock signal to both the frequency analyzing part 13 and the buffer memory 16.

On the other hand, the spectrum analyzer 200 comprises the frequency analyzing apparatus 100 constructed as described above, and a display 17 that displays the result of analysis carried out by the frequency analyzing apparatus 100.

The signal extracting device 11 may be constructed by a high or radio frequency receiver in case a signal to be measured is, for example, a radio wave. In addition, in case a signal to be measured is, for example, a signal obtained from a signal transmission line (a relatively low frequency signal), the signal extracting device 11 may be constructed by a bandpass filter. It is the construction of the frequency analyzing apparatus 100 in case a signal to be measured is a radio wave that is shown in FIG. 8. In such case, an antenna AN is used as a sensor that acquires a signal to be measured, and the antenna AN is connected to the signal extracting device (high frequency receiver in this example) 11. In other words, the antenna AN is connected to an input terminal of the high frequency circuit of a spectrum analyzer that will be usually used, for example, in case of analyzing the frequency of a high frequency signal. Further, in case that a specified frequency band is relatively narrow, and that the signal extracting device 11 is utilized as a means that merely extracts from an input signal thereinto a signal existing in the specified frequency band, the spectrum analyzer makes use of the signal extracting device 11 as a bandpass filter without frequency sweeping.

The high frequency circuit of a spectrum analyzer that will be usually used, in general, down converts in frequency high frequency signals S1, S2 existing in a frequency band to be measured (high frequency band) X shown in FIG. 9A into intermediate frequency signals IF1, IF2 lower in frequency than those of the high frequency signals S1, S2, respectively, as shown in FIG. 9B by use of a super heterodyne receiving system, and outputs them.

Therefore, the signals to be measured S1, S2 existing in the frequency band to be measured X are extracted by the signal extracting device 11 utilized as a bandpass filter in this case, and are inputted into the A/D converter 12 after they are down converted in frequency into the intermediate frequency signals IF1, IF2. In order to abbreviate the explanation, the following description will be given on the assumption that the signals to be measured S1, S2 are inputted into the A/D converter 12 from the signal extracting device 11 without frequency conversion.

The A/D converter 12 converts the signals to be measured S1, S2 into digital signals in synchronism with a clock signal supplied from the clock source 14 to form a series of digital data. The signals to be measured S1, S2 that have been converted into digital data series respectively by the A/D converter 12 are inputted into the frequency analyzing part 13 in which amplitude data of the signals to be measured S1, S2 are computed for frequency of each of sample points in the frequency band to be measured X and frequency analysis is performed.

As the frequency analyzing part 13, a device or apparatus utilizing the fast Fourier transform (FFT) that is already well known (hereinafter, referred to as fast Fourier transform device) may be used, for instance. In case of using the fast Fourier transform device, it is possible to compute, from a signal with which the signals to be measured S1, S2 intermingle, amplitude data of the signals to be measured S1, S2 for frequency of each sample point in the frequency band to be measured X and to perform frequency analysis thereof.

In the frequency analyzing part 13, computation or operation for analyzing the frequency for each of the signals S1 and S2 to be measured is carried out each time the A/D converter 12 outputs, for example, S digital sample values to the frequency analyzing part 13 and at the time point (timing) that the S-th last digital sample value is outputted from the A/D converter 12. Further, in case the A/D converter 12 outputs S digital sample values, the frequency divider 15 forms a 1/S frequency divider or demultiplier that divides the frequency of the clock signal by S.

One frequency analysis computation or operation results in that M data latches 16A, 16B, 16C, . . . , 16M prepared in the buffer memory 16 have respective amplitude data stored therein corresponding to frequencies at the every sample point in the frequency band to be measured X. In this example, since there are S sample points, the number M of the data latches may be an integer equal to or greater than S (M≧S). When the next frequency analysis computation or operation with respect to the next S digital sample values is started in the frequency analyzing part 13, the amplitude data already latched in the buffer memory 16 are sequentially sent out to the display 17 and stored in an image or picture memory of the display 17.

One example of the result of the frequency analysis stored in the image memory of the display 17 is shown in FIG. 10 in diagrammatical form. In this figure, a lateral axis F shows frequency, a vertical axis Y shows amplitude, and a back-and-forth direction (depth direction) axis T shows time. It will be easily understood from the waveforms in FIG. 10 that the result of the frequency analysis for the signals to be measured S1 and S2 at the timing t1, the result of the frequency analysis for the signals to be measured S1 and S2 at the timing t2, have been stored in the image memory, respectively.

The display 17 reads out these results of the frequency analyses at respective timings t1, t2, t3, ... one at a time and indicates it on its display screen to measure the amplitudes of the signals S1 and S2 to be measured, the center frequencies, bandwidths, etc. of the signals S1 and S2 to be measured. Thus, the frequency analyses for the signals to be measured S1 and S2 existing in the frequency band to be measured X can be carried out.

The results of the frequency analyses shown in FIG. 10 illustrate ideal states. In reality, supposing that the signals to be measured S1 and S2 are radio waves generated from portable telephones or mobile (cellular) phones for example, amplitude values thereof are in a state of disorder such that they cannot be distinguished from noises because the radio waves generated from the portable telephones are spread in frequency. Particularly, in case the level of a radio wave is low, it is utterly impossible to discriminate between the radio wave and a noise. For this reason, there is a serious defect in the prior frequency analyzing method and apparatus that the presence of a radio wave the frequency of which is spread as in a portable telephone cannot be reliably detected.

DISCLOSURE OF THE INVENTION

It is an object of the present invention to provide a frequency analyzing method that is capable of reliably detecting presence of a radio wave even if the radio wave is a frequency spread or low level one and of reliably frequency analyzing the detected radio wave.

It is another object of the present invention to provide a frequency analyzing apparatus that is capable of reliably detecting presence of a radio wave even if the radio wave is a frequency spread or low level one and of reliably frequency analyzing the detected radio wave.

It is further object of the present invention to provide a spectrum analyzer that is capable of reliably detecting presence of a radio wave even if the radio wave is a frequency spread or low level one, of reliably frequency analyzing the detected radio wave, and of displaying it.

In order to accomplish the above objects, in a first aspect of the present invention, there is provided a frequency analyzing method comprising the steps of: extracting a signal to be measured that exists in a frequency band to be measured by a plurality of measurement signal extracting devices; frequency analyzing each of the plural extracted signals to be measured; computing a correlation value with respect to results of frequency analyses on the plural signals to be measured; and rendering, when the computed correlation value is equal to or greater than a preset value, a decision that the signal to be measured exists in the analyzed frequency, and when the computed correlation value is smaller than a preset value, a decision that the signal to be measured does not exist in the analyzed frequency.

In a preferred embodiment, the frequency analyzing method further includes the step of converting the plural extracted signals to be measured into digital data respectively, and the frequency analyzing step is carried out by digital operation means.

In addition, the frequency analyzing method further includes the step of adding noises having no correlation with each other to the results of frequency analyses on the plural signals to be measured respectively, and wherein the correlation value computing step computes a correlation value with respect to the plural results of frequency analyses each including the corresponding noise.

The computation of the correlation value is performed by a coherence function.

In a second aspect of the present invention, there is provided a frequency analyzing apparatus comprising: a plurality of measurement signal extracting devices that extract a signal to be measured that exists in a frequency band to be measured; a plurality of A/D converters that convert the signals to be measured extracted by the plural measurement signal extracting devices into digital data, respectively; a plurality of frequency analyzing means that carry out frequency analyses on the plural signals to be measured over the frequency band to be measured on the basis of the digital data outputted respectively from the plural A/D converters; correlation value computing means that computes a correlation value with respect to the results of frequency analyses on the plural signals to be measured outputted respectively from the plural frequency analyzing means; and level decision means that renders, when the correlation value computed by the correlation value computing means is equal to or greater than a preset value, a decision that the signal to be measured exists in the analyzed frequency, and that renders, when the computed correlation value is smaller than a preset value, a decision that the signal to be measured does not exist in the analyzed frequency.

In a preferred embodiment, the frequency analyzing apparatus further includes a plurality of adders provided between each of the output sides of the plural frequency analyzing means and the correlation value computing means, and the plural adders add noise components having no correlation with each other to the results of frequency analyses on the plural signals to be measured outputted respectively from the plural frequency analyzing means, respectively, thereby to prevent the correlation value computing means from becoming unable to compute.

In a third aspect of the present invention, there is provided a spectrum analyzer comprising: a plurality of measurement signal extracting devices that extract a signal to be measured that exists in a frequency band to be measured; a plurality of A/D converters that convert the signals to be measured extracted by the plural measurement signal extracting devices into digital data, respectively; a plurality of frequency analyzing means that carry out frequency analyses on the plural signals to be measured over the frequency band to be measured on the basis of the digital data outputted respectively from the plural A/D converters; correlation value computing means that computes a correlation value with respect to the results of frequency analyses on the plural signals to be measured outputted respectively from the plural frequency analyzing means; level decision means that renders, when the correlation value computed by the correlation value computing means is equal to or greater than a preset value, a decision that the signal to be measured exists in the analyzed frequency, and that renders, when the computed correlation value is smaller than a preset value, a decision that the signal to be measured does not exist in the analyzed frequency; operation means that computes at least the center frequency of the bandwidth of the signal to be measured on the basis of the data representing presence or absence of the signal to be measured outputted from the level decision means; and a display that displays the data representing presence or absence of the signal to be measured outputted from the level decision means.

In a preferred embodiment, the spectrum analyzer further includes a plurality of adders provided between each of the output sides of the plural frequency analyzing means and the correlation value computing means, and the plural adders add noise components having no correlation with each other to the results of frequency analyses on the plural signals to be measured outputted respectively from the plural frequency analyzing means, respectively, thereby to prevent the correlation value computing means from becoming unable to compute.

In another preferred embodiment, the spectrum analyzer further includes noise detecting means that detects whether or not a signal having its frequency bandwidth narrower than a predetermined frequency bandwidth exists in the data representing presence or absence of the signal to be measured outputted from the level decision means, and that when a signal having its frequency bandwidth narrower than a predetermined frequency bandwidth is detected, determines it to be a noise and processes to prevent it from being displayed on the display.

According to the present invention, it is configured that a signal to be measured is extracted by a plurality of signal extracting devices, and the extracted signals to be measured are frequency analyzed respectively, and further, a correlation value on the results of frequency analyses is found. Accordingly, the internal noise component of each signal extracting device is eliminated in the process of computing the correlation value. As a result, the results of frequency analyses from which the influence due to the internal noise component of each signal extracting device is excluded can be obtained.

In addition, the computation of the correlation value is carried out in accordance with a coherence function, and if the obtained correlation value is greater than a preset fixed value, a decision that a signal exists is rendered and if the obtained correlation value is smaller than the preset fixed value, a decision that a signal does not exist is rendered. Therefore, presence and absence of a signal can be determined without being affected by the strength of the signal to be measured. As a result, the results of frequency analyses having good signal-to-noise ratio can be obtained.

BRIEF DESCRIPTION OF THE DRAWINGS

FIG. 9 illustrates waveforms for explaining the operation of the signal extracting device used in the prior spectrum analyzer shown in FIG. 8; and FIG. 10 is a diagrammatical view for explaining one example of the results of frequency analyses stored in the image memory of the display used in the prior spectrum analyzer shown in FIG. 8.

BEST MODE FOR CARRYING OUT THE INVENTION

Now, preferred embodiments of the present invention will be described in detail. The present invention may, however, be embodied in many different forms and should not be construed as limited to the embodiments set forth hereinafter; rather, the embodiments are provided so that this disclosure will be thorough and complete, and will fully convey the scope of the invention to those skilled in the art.

First, there will be described with reference to FIGS. 1 to 5 a first embodiment of the frequency analyzing apparatus according to the present invention, and a first embodiment of the spectrum analyzer according to the present invention in which this frequency analyzing apparatus is built.

Figure 1:
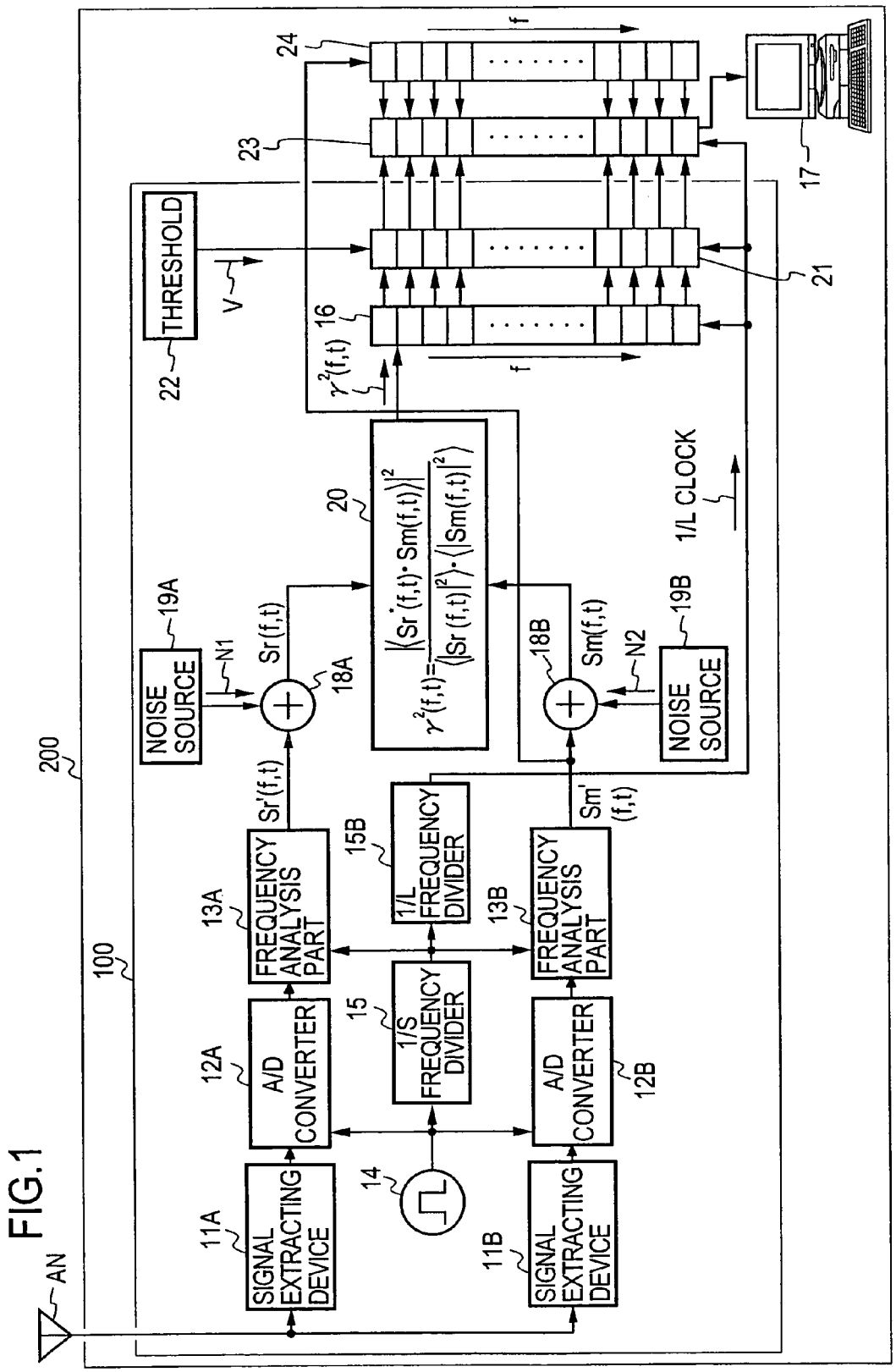
FIG. 1 is a block diagram showing a first embodiment of the spectrum analyzer according to the present invention.
Figure 8:
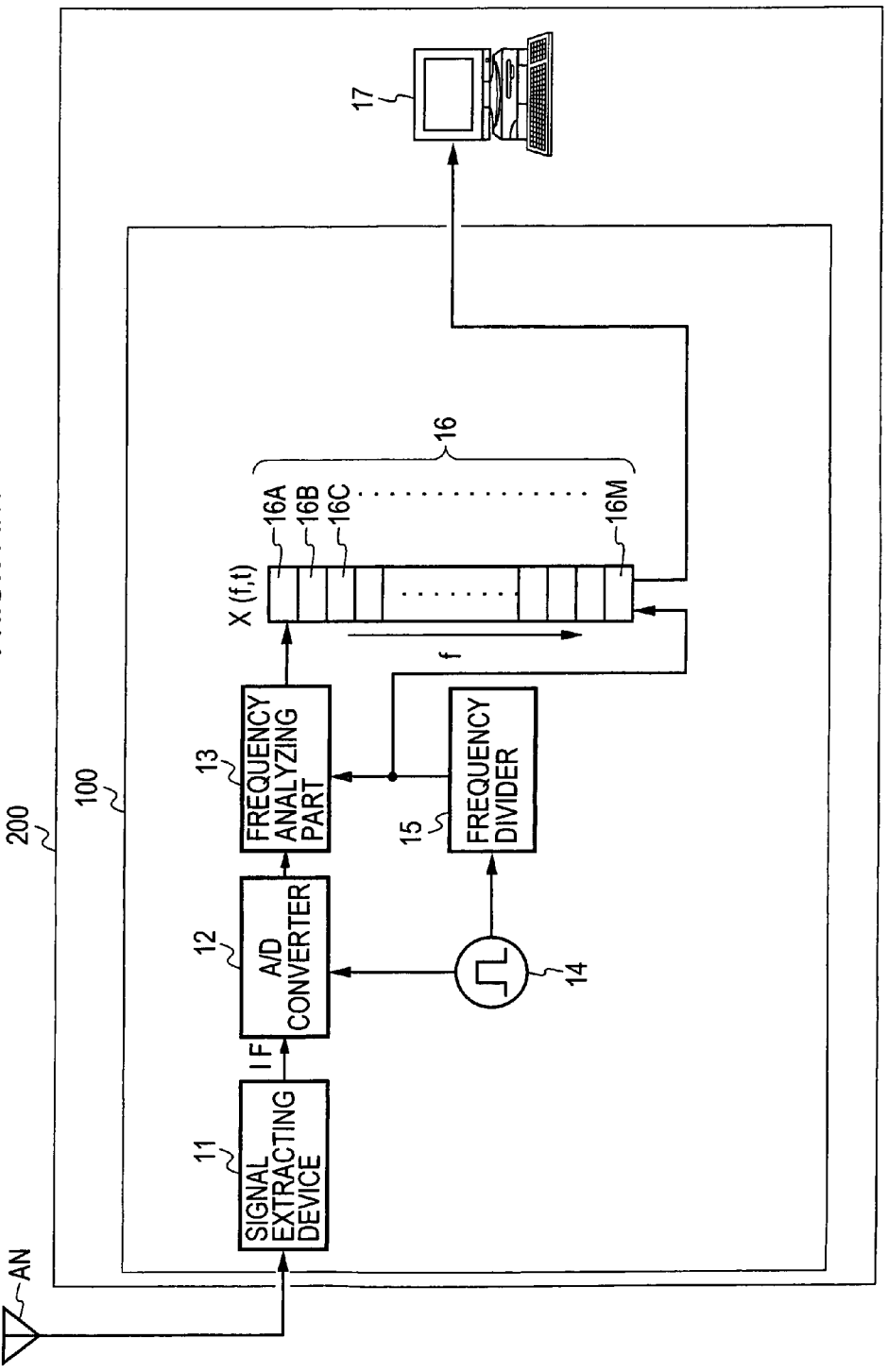
FIG. 8 is a block diagram showing one construction of a prior spectrum analyzer.

FIG. 1 is a block diagram showing the first embodiment of the frequency analyzing apparatus according to the present invention as well as the first embodiment of the spectrum analyzer according to the present invention in which this frequency analyzing apparatus is built. The illustrated frequency analyzing apparatus 100 can suitably operate by using the frequency analyzing method according to the present invention as will become evident later on. Further, in FIG. 1, parts and elements corresponding to those in FIG. 8 will be shown by the same characters affixed thereto, and explanation thereof will be omitted unless necessary.

The spectrum analyzer 200 of the first embodiment comprises the frequency analyzing apparatus 100, an arithmetic and logic unit or operation part 23, a second buffer memory 24, and a display 17. In the frequency analyzing apparatus 100 are provided two system's networks each of which comprises a signal extracting device 11, an A/D converter 12, and a frequency analyzing part 13 all of which may have the same constructions as those of the frequency analyzing apparatus 100 shown in FIG. 8. The one network comprises a first signal extracting device 11A, a first A/D converter 12A, and a first frequency analyzing part 13A, and the other network comprises a second signal extracting device 11B, a second A/D converter 12B, and a second frequency analyzing part 13B.

The frequency analyzing apparatus 100 further comprises: a clock source 14; a first frequency divider or demultiplier 15 that divides the frequency of a clock signal by S; a second frequency divider or demultiplier 15B that divides the frequency of a 1/S clock signal outputted from the first frequency divider 15 by L; first and second noise sources 19A and 19B; a first adder 18A that adds a noise N1 outputted from the first noise source 19A and a first result of frequency analysis (hereinafter, referred to as first spectrogram) Sr'(f, t) outputted from the first frequency analyzing part 13A; a second adder 18B that adds a noise N2 outputted from the second noise source 19B and a second result of frequency analysis (hereinafter, referred to as second spectrogram) Sm'(f, t) outputted from the second frequency analyzing part 13B; a correlation value computing or calculating part 20 that computes a correlation value between the first and second spectrograms Sr'(f, t) and Sm'(f, t) on the basis of the first and second results of additions Sr(f, t) and Sm(f, t) outputted respectively from the first and second adders 18A and 18B; a first buffer memory 16 that stores therein a correlation value $\gamma^2$(f, t) outputted from the correlation value computing part 20; a threshold setting device 22; and a level decision part 21 that compares the correlation value $\gamma^2$(f, t) stored in the first buffer memory 16 with a threshold V.

The clock source 14, and the first and second frequency dividers 15 and 15B are used in common by the two system's networks, and a clock signal outputted from the clock source 14 is supplied to both the first and second A/D converters 12A and 12B as well as to the first frequency divider 15. The first frequency divider 15 divides the frequency of the clock signal supplied thereto by S and supplies the frequency divided clock signal to both the first and second frequency analyzing parts 13A and 13B as well as to the second frequency divider 15B. The second frequency divider 15B further divides the clock signal of 1/S frequency inputted thereto by L, and supplies the clock signal of 1/SL frequency to the first buffer memory 16, the level decision part 21, and the arithmetic and logic unit 23.

The first and second noise sources 19A and 19B supply noises N1 and N2 that have the same level and consist of random numbers having no correlation with each other (namely, non-correlated random numbers) to the corresponding first and second adders 18A and 18B, respectively. As discussed above, the first and second adders 18A and 18B add the first spectrogram Sr'(f, t) outputted from the first frequency analyzing part 13A and the first noise N1 and the second spectrogram Sm'(f, t) outputted from the frequency analyzing part 13B and the second noise N2, respectively, and output the spectrograms Sr(f, t) and Sm(f, t) including the noises N1 and N2, respectively. As will be described later on, as a result of additions of the noises N1 and N2, it becomes possible in the correlation value calculating part 20 to prevent the result of calculation from diverging even if level of a signal to be measured is a very low value that is endlessly close to zero (0).

The threshold setting device 22 outputs a threshold V set for the frequency f at each of the sample points in the frequency band to be measured to the level decision part 21. The level decision part 21 compares the correlation value $\gamma^2$(f, t) between the first and second spectrograms Sr'(f, t) and Sm'(f, t) with the corresponding threshold V outputted from the threshold setting device 22, the correlation value $\gamma^2$(f, t) being computed for the frequency f at each of the sample points in the correlation value computing part 20. In this embodiment, the level decision part 21 is arranged such that it renders a decision, when each correlation value $\gamma^2$(f, t) is greater than the threshold V, that a signal to be measured exists in that frequency, and that it renders a decision, when each correlation value $\gamma^2$(f, t) is smaller than the threshold V, that a signal to be measured does not exist in that frequency.

The signal extracting devices 11A and 11B may be constructed by receivers or bandpass filters having the same bandwidth, respectively, and the same frequency band will be defined to the frequency band to be measured. Now, the operation of the spectrum analyzer in case of detecting whether there exists or not a radio wave (a radio wave generated from a portable telephone, for example) being used in the frequency band to be measured, and analyzing the frequency of the detected radio wave will be described.

Further, as will be readily understood from FIG. 1, an antenna AN for receiving a signal to be measured is connected in common to the first and second signal extracting devices 11A and 11B.

(1) A signal received by the antenna AN is sent to the first and second signal extracting devices 11A and 11B each of which limits in frequency band the signal supplied thereto, down converts in frequency into an intermediate signal, and outputs the intermediate signal. The intermediate signals are sampled by clock signals of frequency fs supplied from the clock source 14 in the first and second A/D converters 12A and 12B, respectively, to convert each intermediate signal into a series of S digital data in this embodiment. The S digital data series outputted respectively from the first and second A/D converters 12A and 12B are analyzed in frequency in the first and second frequency analyzing parts 13A and 13B. As a method of frequency analysis, a method using FFT (fast Fourier transform) may be used as already explained in the prior art of FIG. 8. As a result of the frequency analysis, the first and second two spectrograms Sr'(f, t) and Sm'(f, t) are obtained from the first and second frequency analyzing parts 13A and 13B, respectively.

(2) The noises N1 and N2 (values that consist of random numbers having the same level as mentioned above) supplied from the first and second noise sources 19A and 19B are added to the first and second two spectrograms Sr'(f, t) and Sm'(f, t) obtained from the above process (1) in the first and second adders 18A and 18B so that the first and second adders 18A and 18B output the spectrograms Sr(f, t) and Sm(f, t) including the noises N1 and N2, respectively. As described above, the noises N1 and N2 have no correlation with each other, and the first and second spectrograms Sr'(f, t) and Sm'(f, t) also have no correlation with each other and the amplitudes thereof are the same. At this point, the amplitudes of the noises N1 and N2 are defined to "a".

(3) The above processes (1) and (2) are executed L times, and L spectrograms Sr(f, t) and L spectrograms Sm(f, t) including the noises N1 and N2 respectively are outputted from the first and second adders 18A and 18B to supply them to the correlation value computing part 20. The correlation value computing part 20 finds the correlation values $\gamma^2$(f, t) on the basis of the L data (spectrograms including the noises) outputted respectively from the two system's networks. Each correlation value is calculated, in this embodiment, by the coherence function expressed by the following equation (1).

$$\gamma^2(f, t) = \frac{|\langle Sr*(f, t) \cdot Sm(f, t)\rangle|^2}{\langle |Sr(f, t)|^2\rangle \cdot \langle |Sm(f, t)|^2\rangle} \quad (1)$$

In the above equation (1), the inside of each < > represents ensemble mean of L data, and * represents complex conjugate.

The correlation value $\gamma^2$(f, t) is a real number within the range of $0 \leq \gamma^2$(f, t)$\leq 1.0$, and the closer to 1 the correlation value is, the higher degree of the correlation becomes. Accordingly, it is possible to discriminate between the noise and the signal by evaluating the correlation value $\gamma^2$(f, t). At this point, it is for the purpose of preventing the above equation (1) from diverging that the noises N1 and N2 are added to the first and second spectrograms Sr'(f, t) and Sm'(f, t) that are the results of frequency analyses, respectively.

Figure 2:
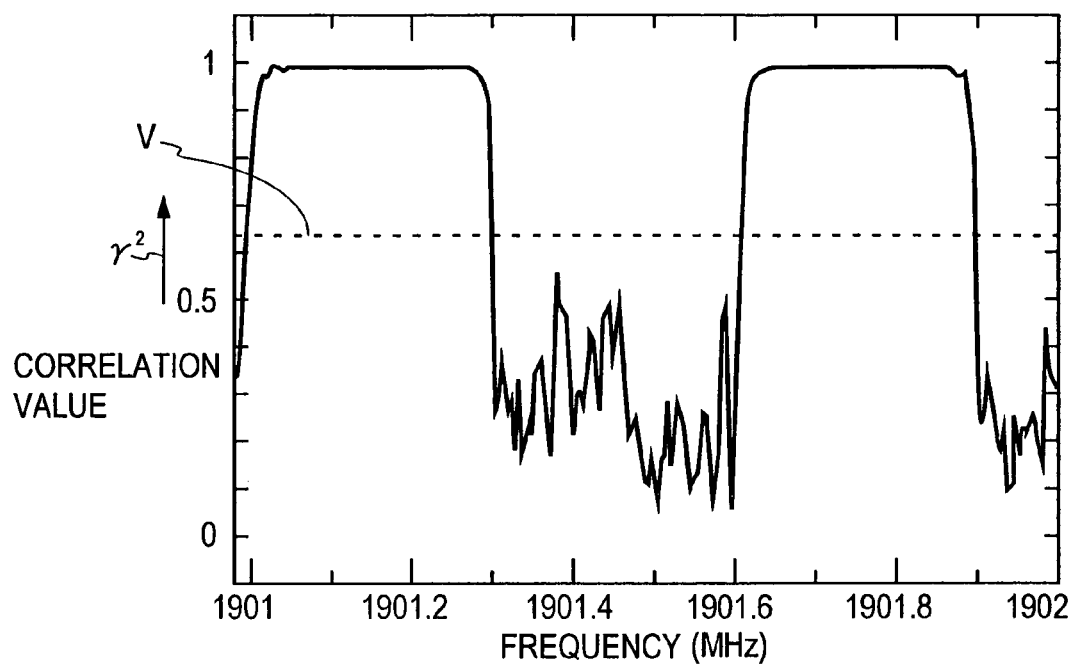
FIG. 2 illustrates a waveform showing one example of the result of frequency analysis performed in the frequency analyzing part used in the spectrum analyzer shown in FIG. 1.

FIG. 2 shows one example of S correlation values $\gamma^2$(f, t), that is, S coherence functions in this embodiment, actually found by carrying out the above processes (1) to (3) on the frequency at each of the sample points (S sample points in this embodiment) in the specified frequency band. In FIG. 2, the abscissa (horizontal axis) shows frequency (MHz) and the ordinate (vertical axis) shows correlation value $\gamma^2(f, t)$. It can be understood from the waveform shown in FIG. 2 that the noise and the signal clearly differ from each other.

The S correlation values $\gamma^2(f, t)$ calculated by the correlation value computing part 20 for frequency at each sample point are stored in the first buffer 16.

(4) A threshold V for each of the correlation values $\gamma^2(f, t)$ stored in the first buffer 16 is determined on the basis of the noise level of each correlation value, and the threshold V is supplied to the level decision part 21 from the threshold setting device 22. The level decision part 21 compares the correlation value $\gamma^2(f, t)$ outputted from the first buffer 16 with the corresponding threshold V, and outputs logical "1" if the correlation value is greater than the threshold V or logical "0" if the correlation value is smaller than the threshold V. The logical "1" or "0" is inputted into the arithmetic and logic unit 23.

The threshold V is determined as follows.

The equation (1) can be rewritten:

$$\gamma^2 = (\text{coherent electric power})^2 / (\text{input electric power})^2 \qquad (2)$$

Here, supposing that "a" represents the amplitude of a noise and "b" represents the amplitude of a communication signal, the above equation (2) can be rewritten if "a" and "b" have no correlation with each other:

$$\gamma^2 = \frac{(b^2)^2}{(a^2 + b^2)^2} \qquad (3)$$

If it is desired to detect a signal having its amplitude "b" greater than double the amplitude "a" of the noise signal, 2×a<b is formed and hence the above equation (3) becomes $\gamma^2 > 16/25$. Therefore, if it is desired to detect a signal having its amplitude greater than double the amplitude "a" of the noises N1 and N2 defined in the above process (2), the threshold V may be set to 16/25.

In other words, in the above process (4), the fact that if the correlation value is greater than the threshold V, then the level decision part 21 outputs logical "1" represents the fact that a signal of above certain level has been detected in the specified frequency band while the L spectrograms Sr(f, t) and Sm(f, t) are computed in the above process (3) (if a time required to obtain one spectrogram Sr(f, t) and Sm(f, t) is T seconds, during L×T seconds).

Figure 3:
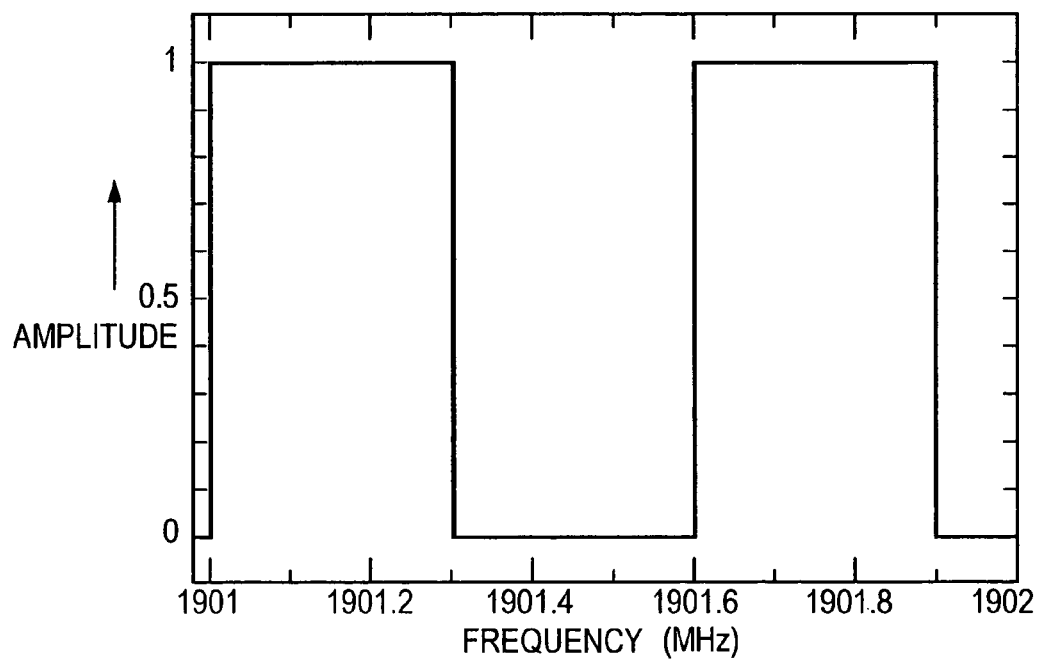
FIG. 3 illustrates a waveform showing the result of frequency analysis obtained in case the frequency analyzing method according to the present invention is applied.

FIG. 3 illustrates a waveform obtained by applying the above process (4) to the waveform shown in FIG. 2. That is, it shows the result of process in the level decision part 21. In this case, the threshold V is selected to 0.64 (16/25) in the value shown in FIG. 2.

(5) Paying attention to a section where logical "1" continues in the decision results obtained from the above process (4), the center frequency and frequency band (frequency range) of a waveform formed by this section are found. Then, the total electric power of the waveform formed by the attention section is found by integrating the spectrogram Sr'(f, t) or Sm'(f, t) in the found frequency band. These are in correspondence to the center frequency, frequency band, and total electric power of a signal (radio wave) to be intended to detect. The computations or operations thereof are performed by the arithmetic and logic unit 23. Further, in this embodiment, the spectrogram Sm'(f, t) outputted from the second frequency analyzing part 13B is stored in the second buffer memory 24, and the center frequency, frequency band, and total electric power of the waveform are computed in the arithmetic and logic unit 23 to find them. However, it is needless to say that the spectrogram Sr'(f, t) outputted from the first frequency analyzing part 13A may be stored in the second buffer memory 24, and the center frequency, frequency band, and total electric power of the waveform may be computed in the arithmetic and logic unit 23 to find them.

(6) The center frequency, frequency band, and total electric power in that frequency band of the received signal are displayed on the display screen of the display 17.

Figure 4A:
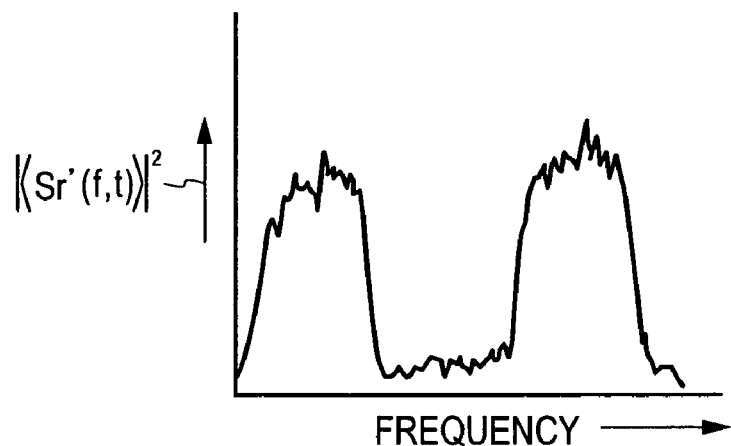
FIG. 4 illustrates waveforms showing the result of frequency analysis performed in a frequency analyzing part usually used in a prior spectrum analyzer, and the result of frequency analysis obtained in case the frequency analyzing method according to the present invention is applied to the prior result of frequency analysis for comparison.
Figure 4B:
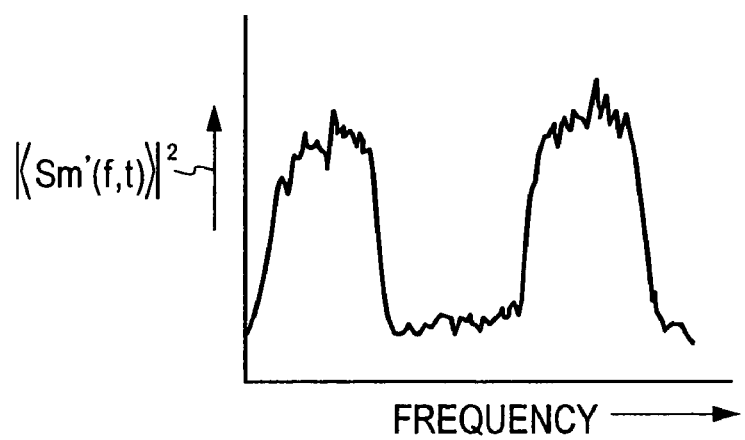
Figure 4C:
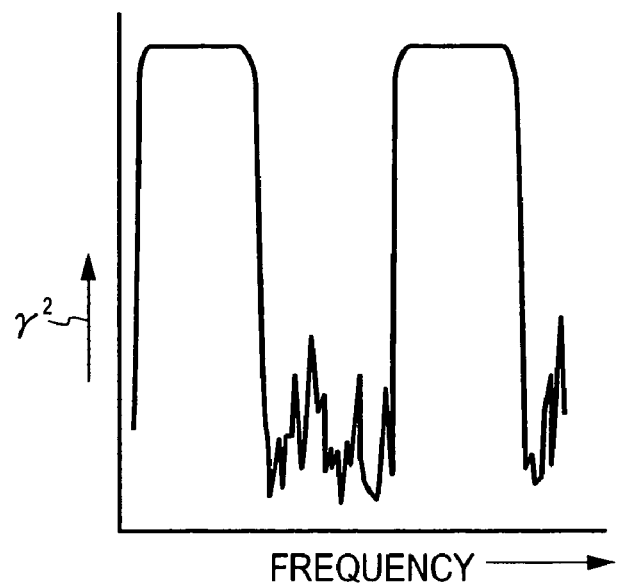

FIG. 4 shows one example of the spectrum indications. FIG. 4A shows the spectrum indication of $|<Sr'(f, t)>|^2$, FIG. 4B shows the spectrum indication of $|<Sm'(f, t)>|^2$, and FIG. 4C shows the spectrum indication of the correlation value $\gamma^2$ These spectrum indications are ones in case the value of L is set to 128.

Figure 5:
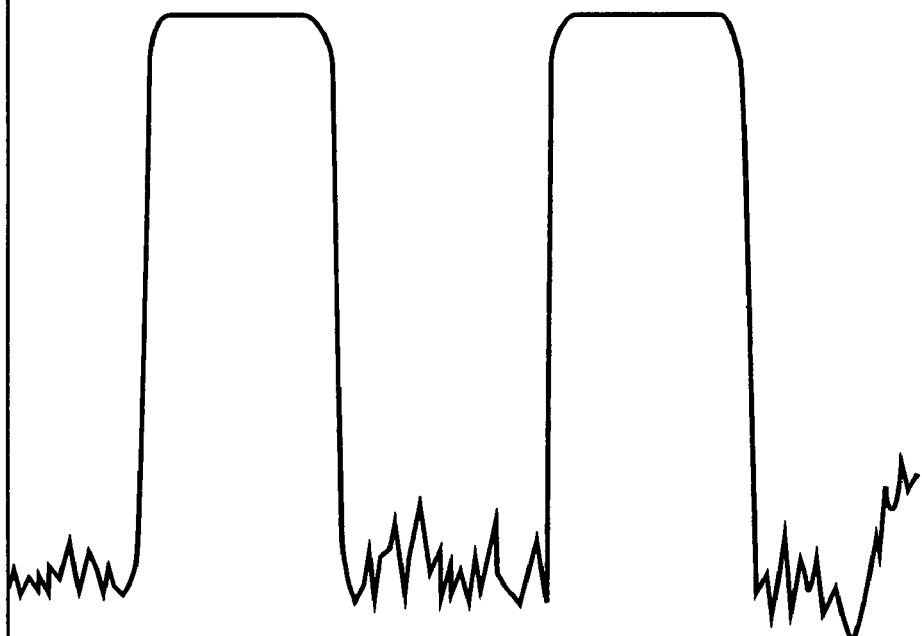
FIG. 5 is a diagram showing the center frequencies, bandwidths, and total electric powers of signals to be measured that are computed by the spectrum analyzer shown in FIG. 1 together with waveforms thereof.

FIG. 5 shows one example of the spectrum indication of the correlation value $\gamma^2$ together with the center frequency (cent), frequency band (width), and total electric power (power) of the received signal found by the arithmetic and logic unit 23 in the above process (5).

Figure 6:
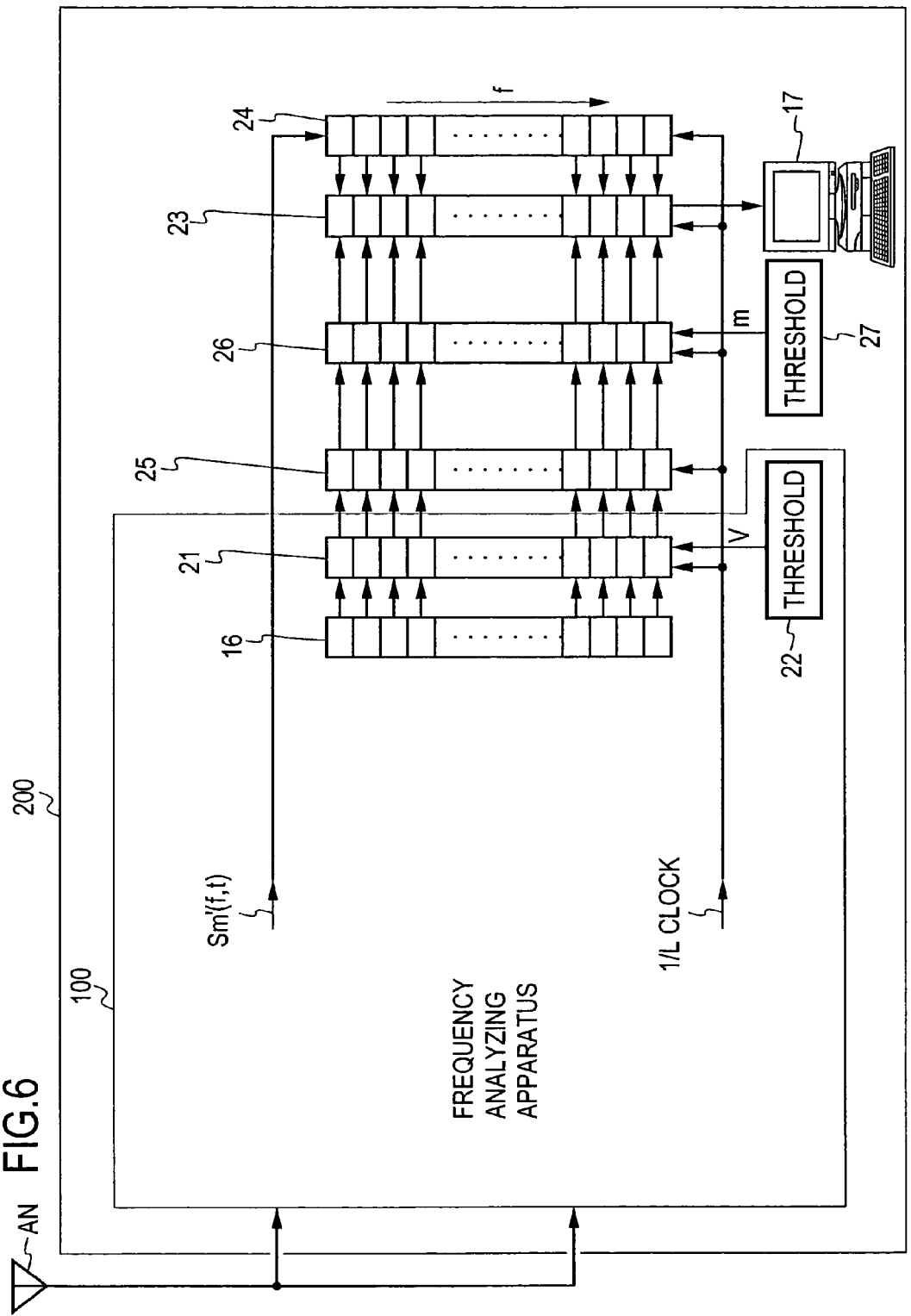
FIG. 6 is a block diagram showing a second embodiment of the spectrum analyzer according to the present invention.

FIG. 6 is a block diagram showing a second embodiment of the spectrum analyzer according to the present invention. This second embodiment is characterized in that it has not only the same function as that of the first embodiment discussed above, but also has further function that, in case an impulse-like noise intermingles from the outside, eliminates such impulse-like noise. In order to simplify the drawing, the circuit construction of the signal extracting devices 11A and 11B through the correlation value computing or calculating part 20 that are the same as those in the first embodiment is omitted from FIG. 6. Further, in FIG. 6, portions and elements corresponding to those in FIG. 1 will be shown by the same characters affixed thereto, and explanation thereof will be omitted unless necessary.

In the second embodiment, a third buffer memory 25 is provided at the output side of the level decision part 21, and logical "1" or "0" outputted from the level decision part 21 is temporally stored in the third buffer memory 25. Moreover, a frequency bandwidth decision part 26 is provided at the output side of the third buffer memory 25. This frequency bandwidth decision part 26 checks whether logical "1" continues over a predetermined frequency bandwidth or not, and if not, it renders a decision that logical "1" supplied thereto from the third buffer memory 25 is a noise and converts that logical "1" into logical "0" to output it to the arithmetic and logic unit 23. If logical "1" continues over the predetermined frequency bandwidth, the frequency bandwidth decision part 26 renders a decision that it is a signal to be intended to detect and outputs logical "1"s as they are to the arithmetic and logic unit 23. Accordingly, even if an impulse-like noise intermingles with the received signal, such noise can be eliminated from the received signal.

As a base for checking whether logical "1" continues over the predetermined frequency bandwidth or not, a threshold m is supplied to the frequency bandwidth decision part 26 from the second threshold setting device 27. At this point, m represents a frequency bandwidth corresponding to one address of the third buffer memory 25. As a result, m becomes an integer equal to or greater than 2. The frequency bandwidth decision part 26 renders a decision that, if the number of consecutive logical "1"s supplied thereto from the third buffer memory 25 is less than the threshold m, these logical "1"s are a noise, and the frequency bandwidth decision part 26 converts these logical "1"s supplied thereto into logical "0"s and outputs the logical "0"s to the arithmetic and logic unit 23.

The detailed operation of the spectrum analyzer of the second embodiment constructed as mentioned above will be now listed.

(1) A signal received by the antenna AN is limited in frequency band in the first and second signal extracting devices 11A and 11B (see FIG. 1), and thereafter, the first and second signal extracting devices 11A and 11B down convert the band-limited signals in frequency into intermediate signals, respectively, and output them. The intermediate signals are sampled by clock signals of frequency fs in the first and second A/D converters 12A and 12B (see FIG. 1), respectively, to convert each intermediate signal into a series of S digital data. The two S digital data series are analyzed in frequency in the first and second frequency analyzing parts 13A and 13B (see FIG. 1) respectively to obtain the first and second two spectrograms Sr'(f, t) and Sm'(f, t).

(2) The noises N1 and N2 (values that consist of non-correlated random numbers and have the same amplitude) are added to the first and second two spectrograms Sr'(f, t) and Sm'(f, t) obtained from the above process (1) to obtain the spectrograms Sr(f, t) and Sm(f, t) including the noises N1 and N2, respectively. As described above, the noises N1 and N2 have no correlation with each other, and the first and second spectrograms Sr'(f, t) and Sm'(f, t) also have no correlation with each other and the amplitudes thereof are the same. At this point, the amplitudes of the noises N1 and N2 are defined to "a".

(3) The above processes (1) and (2) are executed L times, and L spectrograms Sr(f, t) and L spectrograms Sm(f, t) including the noises N1 and N2 respectively are obtained. The correlation value computing part 20 computes, using the coherence function of the equation (1) used in the above first embodiment, the correlation values $\gamma^2(f, t)$ on the basis of these L spectrograms Sr(f, t) and L spectrograms Sm(f, t). In a similar way, the correlation value $\gamma^2(f, t)$ is computed for frequency at each of the sample points, and these computed S correlation values $\gamma^2(f, t)$, the coherence functions in this embodiment, are stored in the first buffer 16.

(4) A threshold V for each of the correlation values $\gamma^2(f, t)$ stored in the first buffer 16 is determined on the basis of the noise level of each correlation value, and the threshold V is supplied to the level decision part 21 from the threshold setting device 22. The level decision part 21 compares the correlation value $\gamma^2(f, t)$ with the corresponding threshold V, and outputs logical "1" if the correlation value is greater than the threshold V or logical "0" if the correlation value is smaller than the threshold V. The threshold V is determined in the same way as that in the first embodiment. The logical "1" or "0" signal outputted from the level decision part 21 is stored in the third buffer memory 25.

(5) The threshold m is supplied to the frequency bandwidth decision part 26 from the second threshold setting device 27 thereby to check whether the number of consecutive logical "1"s supplied thereto from the third buffer memory 25 is less than the threshold m. If the number of consecutive logical "1"s is less than the threshold m, these logical "1"s supplied from the third buffer memory 25 are converted into logical "0"s which are in turn outputted to the arithmetic and logic unit 23.

As described above, since m represents a frequency bandwidth corresponding to one address of the third buffer memory 25, m becomes an integer equal to or greater than 2. In such case, the frequency bandwidth for observing the inside of the third buffer memory 25 must be set to the maximum value in values less than 2×m. For example, if m is set to three (m=3), in order to check whether the number of consecutive logical "1"s is less than three or not, the maximum value in values less than 2×m becomes five. Accordingly, the frequency bandwidth for observing the inside of the third buffer memory 25 is set to one corresponding to five addresses of the third buffer memory 25. The reason is that it becomes possible by such setting of the frequency bandwidth that the above process (5) is effectively carried out without counting one signal twice.

Figure 7:
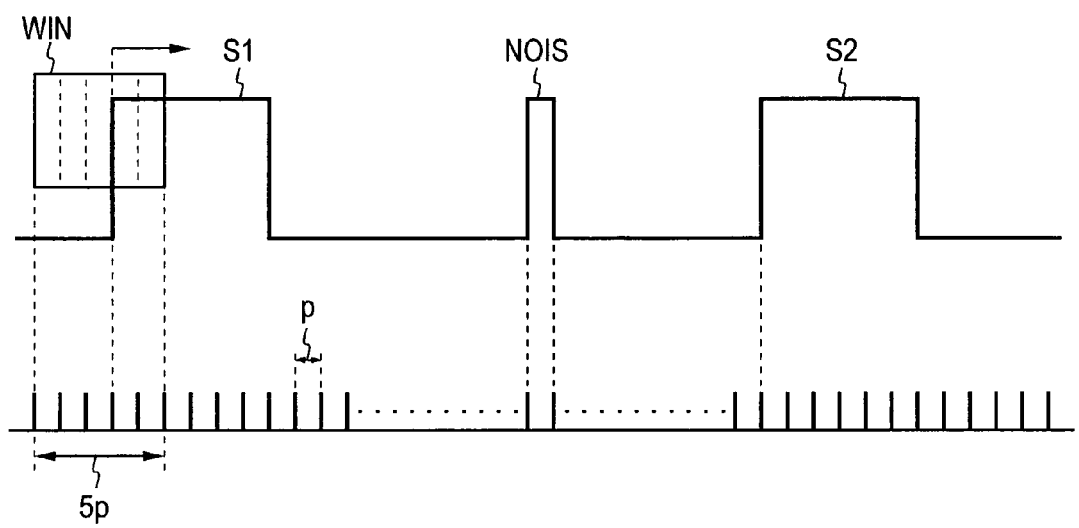
FIG. 7 illustrates a waveform for explaining the operation of the second embodiment of the spectrum analyzer shown in FIG. 6.

FIG. 7 illustrates a waveform for explaining the checking operation of the frequency bandwidth decision part 26. In FIG. 7, the abscissa (horizontal axis) corresponds to frequency f and also corresponds to the addresses of the third buffer memory 25. In FIG. 7, short vertical lines at regular intervals shown under waveforms S1, S2 and NOIS represent the addresses of the third buffer memory 25. Since "p" represents the frequency bandwidth corresponding to one address of the third buffer memory 25, it corresponds to the length between two adjacent short vertical lines as shown in FIG. 7. The operation in case the threshold m is set to three (m=3) is illustrated in FIG. 7. In this case, if the number of consecutive logical "1"s is three or more, a decision is rendered that it is not a noise (that is, it is a signal), and if the number of consecutive logical "1"s is less than three (one or two), a decision is rendered that it is a noise and the logical "1" is converted into logical "0".

The waveforms S1, S2 and NOIS are ones that are formed by logical "1" and "0" stored in the third buffer memory 25. In addition, WIN denotes a window for deciding whether or not logical "1"s stored in the third buffer memory 25 are continuing over the predetermined frequency bandwidth or more. The frequency bandwidth of the window WIN corresponds to five addresses that is the maximum value less than 2×3=6 because of m=3 in this example.

The window WIN is moved from the first address of the third buffer memory 25 with a pitch of p corresponding to one address (in the example shown in FIG. 7, the window WIN is moved in the right direction that the frequency becomes higher), and measures a length (frequency bandwidth) of a section where logical "1" continues in the third buffer memory 25. When the window WIN passes through the waveforms, the waveforms S1 and S2 have been stored in the consecutive six addresses, respectively, and hence the length of the section where logical "1" continues is 6. Therefore, they are judged to be signals to be detected, respectively, and sent to the arithmetic and logic unit 23 without being converted into logical "0"s. Since the waveform NOIS has been stored in only one address, the length of the section where logical "1" continues is 1, and it is determined to be an external noise. As a result, logical "1" of the waveform NOIS is converted into logical "0", and hence the external noise is eliminated. Because of m=3, even if logical "1" is stored in two consecutive addresses of the third buffer memory 25, the corresponding waveform is determined to be an external noise, and the logical "1"s of that waveform are converted into logical "0"s. Accordingly, such waveform is also eliminated.

In this way, if an impulse-like noise from the outside intermingles with the received signal, it is possible to eliminate the impulse-like noise almost completely by checking the continuity of the results of frequency analyses stored in the third buffer memory 25, because the impulse-like noise has hardly any bandwidth and is similar to a line spectrum.

Moreover, since the frequency bandwidth of the window WIN for observing the inside of the third buffer memory 25 is set to the maximum value less than 2×m, it is only one signal that can be observed by the window WIN. Accordingly, there occurs no mistake that one signal is counted twice.

Further, in each of the embodiments, the expression that a radio wave is received by merely an antenna AN has been used. However, in order to make the sensitivity high, it is also considered that a receiving system such as a diversity system for example may be adopted. Therefore, the antenna AN is merely illustrated as one example of means for receiving a radio wave.

In addition, though there has been described the case that two system's networks each of which comprises the signal extracting device, an A/D converter and frequency analyzing part have been provided, it is also considered that arbitrary number of networks more than two systems each comprising the signal extracting device, an A/D converter and frequency analyzing part may be provided. Therefore, the number of networks each comprising the signal extracting device, an A/D converter and frequency analyzing part is not limited to two systems. If three or more system's networks may be provided, with respect to results of frequency analyses on arbitrary number of two or more signals, the correlation thereof will be computed in the correlation value computing part.

Moreover, without adding noises having no correlation with each other to the results of frequency analyses outputted respectively from a plurality of frequency analyzing parts, the correlation with respect to a plurality of results of frequency analyses may be computed in the correlation value computing part.

Further, it goes without saying that the number of samples (S) in converting the received signal into digital signals, the number of results of frequency analyses (L) used in computing the correlation, values of the thresholds V and m, etc. are nothing but one example, and that they may be altered or changed in various manners as occasion arises.

As is clear from the foregoing, in accordance with the present invention, it is arranged that a signal to be measured is extracted by a plurality of signal extracting devices, a correlation value for frequency at each of sample points is computed on the basis of results of frequency analyses on the extracted signals, and logical "1" is outputted if each correlation value is greater than a predetermined value, or logical "0" is outputted if each correlation value is smaller than a predetermined value, thereby to display the results of frequency analyses. Accordingly, there is obtained a remarkable advantage that even if the signal to be measured is a low level signal the frequency of which is spread, the presence of such signal can be clearly and distinctly displayed.

In addition, there is also obtained an advantage that measurement of radio wave utilization density for checking whether or not a radio wave exists in the frequency band to be measured can be easily carried out.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A frequency analyzing method comprising the steps of:
    applying a plurality of measurement signal extracting devices to a signal to be measured that exists in a frequency band to be measured to generate plural extracted signals;
    frequency analyzing each of the plural extracted signals;
    computing a correlation value with respect to results of frequency analyses on the plural extracted signals; and
    rendering, when the computed correlation value is greater than a preset value, a decision that the signal to be measured exists in an analyzed frequency, and when the computed correlation value is smaller than a preset value, a decision that the signal to be measured does not exist in the analyzed frequency.

2. The frequency analyzing method as set forth in claim 1, further comprising a step of converting the plural extracted signals into digital data respectively; and wherein
    the frequency analyzing step is carried out by digital operation means.

3. The frequency analyzing method as set forth in claim 2, further comprising the step of adding noises having no correlation with each other to the results of frequency analyses on the plural extracted signals respectively; and wherein
    the correlation value computing step computes a correlation value with respect to the plural results of frequency analyses each including the corresponding noise.

4. The frequency analyzing method as set forth in claim 3, wherein the computation of the correlation value is performed by a coherence function.

5. The frequency analyzing method as set forth in claim 1, further comprising a step of adding noises having no correlation with each other to the results of frequency analyses on the plural extracted signals respectively; and wherein
    the correlation value computing step computes a correlation value with respect to the plural results of frequency analyses each including the corresponding noise.

6. The frequency analyzing method as set forth in any one of claims 1 to 5, wherein the computation of the correlation value is performed by a coherence function.

7. The frequency analyzing method as set forth in any one of claims 1 to 5, further comprising the step of computing at least the center frequency of the bandwidth of the signal to be measured on the basis of the decision indicating presence or absence of the signal to be measured.

8. A frequency analyzing apparatus comprising:
    a plurality of measurement signal extracting devices responsive to a signal to be measured that exists in a frequency band to be measured to extract pluraly extracted signals;
    a plurality of A/D converters that convert the plural extracted signals into digital data, respectively;
    a plurality of frequency analyzing means that carry out frequency analyses on the plural extracted signals over the frequency band to be measured on the basis of the digital data outputted respectively from the plural A/D converters;
    correlation value computing means that computes a correlation value with respect to the results of frequency analyses on the plural extracted signals outputted respectively from the plural frequency analyzing means; and level decision means that renders, when the correlation value computed by the correlation value computing means is greater than a preset value, a decision that the signal to be measured exists in an analyzed frequency, and that renders, when the computed correlation value is smaller than a preset value, a decision that the signal to be measured does not exist in the analyzed frequency.

9. The frequency analyzing apparatus as set forth in claim 8, further comprising a plurality of adders provided between each of the output sides of the plural frequency analyzing means and the correlation value computing means; and wherein the plural adders add noise components having no correlation with each other to the results of frequency analyses on the plural extracted signals outputted respectively from the plural frequency analyzing means, respectively.

10. The frequency analyzing apparatus as set forth in claim 8 or claim 9, further comprising operation means that computes at least the center frequency of the bandwidth of the signal to be measured on the basis of the data representing presence or absence of the signal to be measured outputted from the level decision means.

11. A spectrum analyzer comprising:
a plurality of measurement signal extracting devices that extract a signal to be measured that exists in a frequency band to be measured;
a plurality of A/D converters that convert the signals to be measured extracted by the plural measurement signal extracting devices into digital data, respectively;
a plurality of frequency analyzing means that carry out frequency analyses on the plural signals to be measured over the frequency band to be measured on the basis of the digital data outputted respectively from the plural A/D converters;
correlation value computing means that computes a correlation value with respect to the results of frequency analyses on the plural signals to be measured outputted respectively from the plural frequency analyzing means;
level decision means that renders, when the correlation value computed by the correlation value computing means is greater than a preset value, a decision that the signal to be measured exists in an analyzed frequency, and that renders, when the computed correlation value is smaller than a preset value, a decision that the signal to be measured does not exist in the analyzed frequency;
operation means that computes at least the center frequency of the bandwidth of the signal to be measured on the basis of the data representing presence or absence of the signal to be measured outputted from the level decision means; and
a display that displays the data representing presence or absence of the signal to be measured outputted from the level decision means.

12. A spectrum analyzer comprising:
a plurality of measurement signal extracting devices that extract a signal to be measured that exists in a frequency band to be measured;
a plurality of A/D converters that convert the signals to be measured extracted by the plural measurement signal extracting devices into digital data, respectively;
a plurality of frequency analyzing means that carry out frequency analyses on the plural signals to be measured over the frequency band to be measured on the basis of the digital data outputted respectively from the plural A/D converters;
a plurality of adders that are provided at each of the output sides of the plural frequency analyzing means and add noise components having no correlation with each other to the results of frequency analyses on the plural signals to be measured outputted respectively from the plural frequency analyzing means, respectively;
correlation value computing means that computes a correlation value with respect to the results of frequency analyses each including the corresponding noise component on the plural signals to be measured outputted respectively from the plural adders;
level decision means that renders, when the correlation value computed by the correlation value computing means is greater than a preset value, a decision that the signal to be measured exists in an analyzed frequency, and that renders, when the computed correlation value is smaller than a preset value, a decision that the signal to be measured does not exist in the analyzed frequency;
operation means that computes at least the center frequency of the bandwidth of the signal to be measured on the basis of the data representing presence or absence of the signal to be measured outputted from the level decision means; and
a display that displays the data representing presence or absence of the signal to be measured outputted from the level decision means.

13. The spectrum analyzer as set forth in claim 11 or claim 12, further comprising noise detecting means that detects whether or not a signal having its frequency bandwidth narrower than a predetermined frequency bandwidth exists in the data representing presence or absence of the signal to be measured outputted from the level decision means, and that when a signal having its frequency bandwidth narrower than a predetermined frequency bandwidth is detected, determines it to be a noise and processes to prevent it from being displayed on the display.

* * * * *